(12) United States Patent
Hikita et al.

(10) Patent No.: US 7,436,237 B2
(45) Date of Patent: Oct. 14, 2008

(54) DISTORTION REDUCING SEMICONDUCTOR SWITCH

(75) Inventors: Masahiro Hikita, Ashiya (JP); Manabu Yanagihara, Toyonaka (JP); Daisuke Ueda, Ibaraki (JP)

(73) Assignee: Matsushita Electric Indsutrial Co., Ltd., Osaka (JP)

( * ) Notice: Subject to any disclaimer, the term of this patent is extended or adjusted under 35 U.S.C. 154(b) by 98 days.

(21) Appl. No.: 11/138,474

(22) Filed: May 27, 2005

(65) Prior Publication Data

US 2005/0264341 A1 Dec. 1, 2005

(30) Foreign Application Priority Data

May 31, 2004 (JP) .............................. 2004-161036

(51) Int. Cl.
*H03K 17/16* (2006.01)
(52) U.S. Cl. ...................................... 327/379; 327/383
(58) Field of Classification Search ................ 327/427, 327/374–379, 383, 389, 308; 326/21, 23, 326/26, 27; 333/81 R
See application file for complete search history.

(56) References Cited

U.S. PATENT DOCUMENTS

| | | | | |
|---|---|---|---|---|
| 3,761,741 A | * | 9/1973 | Hoeft ........................ | 327/308 |
| 5,130,571 A | * | 7/1992 | Carroll ....................... | 327/94 |
| 5,281,928 A | * | 1/1994 | Ravid et al. ................ | 333/81 R |
| 5,506,528 A | * | 4/1996 | Cao et al. ................... | 327/108 |
| 5,903,178 A | * | 5/1999 | Miyatsuji et al. ........... | 327/308 |
| 5,969,560 A | * | 10/1999 | Kohama et al. ............. | 327/308 |
| 6,169,443 B1 | * | 1/2001 | Shigehara et al. .......... | 327/534 |
| 6,279,145 B1 | * | 8/2001 | Wong ......................... | 716/17 |
| 6,489,856 B1 | * | 12/2002 | Weigand .................... | 333/81 R |
| 6,552,576 B1 | * | 4/2003 | Bobba et al. ................ | 326/113 |
| 6,586,786 B2 | * | 7/2003 | Kitazawa et al. ........... | 257/275 |
| 6,597,231 B2 | * | 7/2003 | Tsutsumi .................... | 327/378 |
| 6,853,235 B2 | * | 2/2005 | Nakayama et al. ......... | 327/379 |
| 6,933,802 B2 | * | 8/2005 | Kushitani et al. .......... | 333/103 |

FOREIGN PATENT DOCUMENTS

JP 7-086899 3/1995
JP 7-106937 4/1995

OTHER PUBLICATIONS

English language Abstract of JP 07-106937.
English Language Abstract of JP 7-086899.

* cited by examiner

*Primary Examiner*—Lincoln Donovan
*Assistant Examiner*—Hai L. Nguyen
(74) *Attorney, Agent, or Firm*—Greenblum & Bernstein, P.L.C.

(57) ABSTRACT

A semiconductor switch includes a first semiconductor circuit having a nonlinear characteristic, and a second semiconductor circuit having a nonlinear characteristic. Each of the first semiconductor circuit and the second semiconductor circuit is configured to at least one of allow and interrupt transmission of a signal. The first semiconductor circuit reduces the nonlinear characteristic of the second semiconductor circuit and the second semiconductor circuit reduces the nonlinear characteristic of the first semiconductor circuit.

19 Claims, 2 Drawing Sheets

DISTORTION REDUCING SEMICONDUCTOR SWITCH

BACKGROUND OF THE INVENTION (1) Field of the Invention

The present invention relates to a semiconductor switch for use with a mobile communication device, and particularly to a high-frequency semiconductor switch that is used for switching between signal transmission and reception in an antenna of a mobile phone or the like.

(2) Description of the Related Art

With the recent developments in the field of mobile communications, a small, low-power high-frequency semiconductor switch has been desired as a semiconductor switch dedicated to switching between signal transmission and reception in an antenna of a mobile phone or the like. In these days, a semiconductor switch that utilizes a gallium arsenide field-effect transistor that is superior in terms of power consumption is used instead of the mainstream semiconductor switch that utilizes a silicon PIN diode.

The following describes a high-frequency semiconductor switch that utilizes such a field-effect transistor (FET). FIG. 1 is a circuit diagram showing a conventional semiconductor switch.

This semiconductor switch is made up of an input terminal 501, an output terminal 502, a through FET 505 that allows or interrupts the transmission of a high-frequency signal between the input terminal 501 and the output terminal 502, and a shunt FET 506 that connects and disconnects the output terminal 502 and the ground. In this case, the gate electrode of the through FET 505 is connected to a control terminal 503 via a resistance 507, and the gate electrode of the shunt FET 506 is connected to a control terminal 504 via a resistance 508. These resistances 507 and 508 are inserted for the protection of the gate electrodes. In general, resistances whose resistance values are several times as great as those of the characteristic impedance of a line are selected as the resistances 507 and 508.

In the semiconductor switch with the above structure, the input terminal 501 and the output terminal 502 become connected when the through FET 505 is turned to the ON-state and the shunt FET 506 is turned to the OFF-state by applying, to the control terminal 503, a voltage higher than the pinch-off voltage of the through FET 505 and by applying, to the control terminal 504, a voltage lower than the pinch-off voltage of the shunt FET 506, respectively. Meanwhile, when the through FET 505 is turned to the OFF-state and the shunt FET 506 is turned to the ON-state, the connection of the input terminal 501 and the output terminal 502 are broken, and the output terminal 502 becomes connected to the ground.

Technologies for improving the linearity in the transmission property of such a semiconductor switch described above include, for example, a method that uses FETs with different pinch-off voltages as a through FET and a shunt FET. Japanese Laid-Open Patent application No. 07-106937 discloses a semiconductor switch using this method. This technology reduces a distortion in a semiconductor switch by controlling power leakage that occurs when the shunt FET is in the OFF-state by using, for example, a FET with a pinch-off voltage of −1.0V as the through FET and a FET with a pinch-off voltage lower than 0.5V as the shunt FET. However, such a semiconductor switch has a problem of poor controllability of pinch-off voltage and an increase in the manufacturing costs since FETs with different pinch-off voltages are formed in the same substrate.

SUMMARY OF THE INVENTION

The conventional semiconductor switch has a problem as described below.

The current-voltage characteristics between the source and the drain of a FET in the ON-state are not completely linear. Thus, while the conventional semiconductor switch is capable of reducing a distortion attributable to the shunt FET, it cannot reduce a distortion attributable to the through FET because a harmonic distortion is generated without fail at a point in time when a high-frequency signal passes through the through FET that is connected serially to the signal path. The value of such a harmonic distortion is greater as the voltage amplitude of a high-frequency signal is larger. In the case where a semiconductor switch with such harmonic distortion is used for a mobile phone or the like, power leakage into another frequency band occurs. Thus, a semiconductor switch for use with a mobile phone or the like is particularly required to be capable of reducing harmonic distortion of a signal passing through such semiconductor switch.

The present invention has been conceived in view of the above problem, and it is an object of the present invention to provide a semiconductor switch that is capable of reducing harmonic distortion of a signal passing through such semiconductor switch.

In order to achieve the above object, the semiconductor switch according to the present invention is a semiconductor switch including a first semiconductor circuit having a nonlinear characteristic and a second semiconductor circuit having a nonlinear characteristic, each allowing or interrupting transmission of a signal, wherein the first semiconductor circuit and the second semiconductor circuit reduce each other's nonlinear characteristic. Here, a current-voltage characteristic of the first semiconductor circuit may satisfy $I1=\Sigma a_i*(V1)^i$, where V1 is a voltage applied to the first semiconductor circuit, I1 is an electric current that passes through the first semiconductor circuit when the V1 is applied, and $a_i$ is a constant, and a current-voltage characteristic of the second semiconductor circuit may satisfy $I2=\Sigma b_i*(V2)^i$, where V2 is a voltage applied to the second semiconductor circuit, I2 is an electric current that passes through the second semiconductor circuit when the V2 is applied, and $b_i$ is a constant, wherein the signs of $a_j$ and $b_j$ of at least one pair of $a_i$ and $b_i$ are different, where j is 2 or a larger integer.

Accordingly, harmonic distortion of a signal passing through the semiconductor switch is reduced since it is possible to reduce the ith-order harmonic distortion by causing the first semiconductor circuit and the second semiconductor circuit to reduce each other's absolute value of the ith order coefficient included in the power series obtained by expanding the current-voltage characteristics.

Furthermore, the first semiconductor circuit and the second semiconductor circuit may be connected in parallel with each other, the first semiconductor circuit may include a field-effect transistor, and the second semiconductor circuit may include a diode. The diode of the second semiconductor circuit may include a first diode and a second diode that are placed in parallel with each other, wherein a forward current of the first diode may be in a direction from a signal output side to a signal input side of the second semiconductor circuit, and a forward current of the second diode may be in a direction from the signal input side to the signal output side of the second semiconductor circuit. The second semiconductor circuit may include: a first voltage generating circuit that is connected to the first diode and that shifts an ON-voltage of the first diode; and a second voltage generating circuit that is connected to the second diode and that shifts an ON-voltage of the second diode.

Accordingly, it is possible to reduce the third-order harmonic distortion of a signal passing through the semiconductor switch.

Moreover, the first semiconductor circuit and the second semiconductor circuit may be connected in parallel with each other, the first semiconductor circuit may include a field-effect transistor, and the second semiconductor circuit may include a field-effect transistor in which a gate and one of a source and a drain are short-circuited. Here, each of the first field-effect transistor and the second field-effect transistor may be a multi-gate field-effect transistor.

Accordingly, it becomes possible to provide a semiconductor switch that is easier to manufacture since the distortion reducing circuit is formed only by a FET.

Furthermore, the second semiconductor circuit may include a first field-effect transistor and a second field-effect transistor that are placed in parallel with each other, wherein a gate and one of a source and a drain of the first field-effect transistor may be short-circuited at a signal input side of the second semiconductor circuit, and a gate and one of a source and a drain of the second field-effect transistor may be short-circuited at a signal output side of the second semiconductor circuit. Here, the field-effect transistor of the second semiconductor circuit may be a multi-gate field-effect transistor.

Accordingly, it becomes possible to provide a small semiconductor switch since there is no need to be equipped with a FET dedicated to turning the distortion reducing circuit to the OFF-state. In other words, it becomes possible to provide a semiconductor switch whose chip area can be reduced.

As is obvious from the above description, the semiconductor switch according to the present invention is capable of improving the linearity of the current-voltage characteristics of the semiconductor switch since the second semiconductor circuit reduces the current-voltage characteristics of the first semiconductor circuit so as to approximate such current-voltage characteristics to be linear. In other words, it is possible for the semiconductor switch of the present invention to reduce a harmonic distortion that is generated by a high-frequency signal passing through the semiconductor switch.

The disclosure of Japanese Patent Application No. 2004-161036 filed on May 31, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following describes a semiconductor switch according to the preferred embodiments of the present invention with reference to the drawings.

First Embodiment

Figure 2:
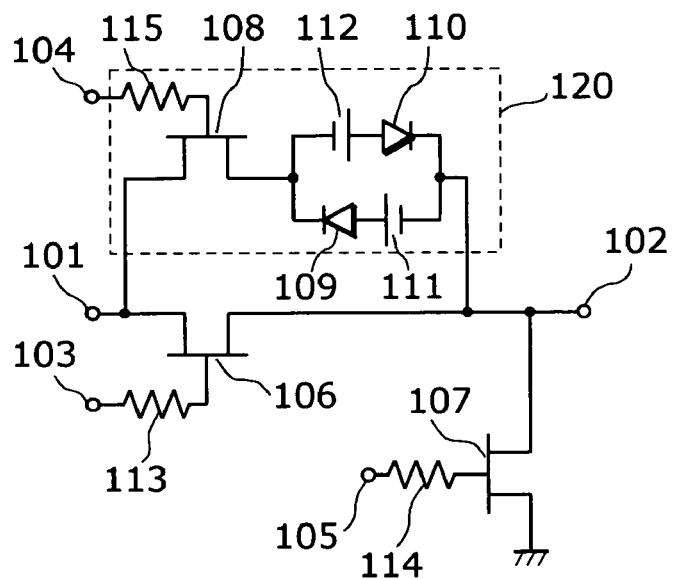
FIG. 2 is a circuit diagram showing a semiconductor switch according to a first embodiment of the present invention.

FIG. 2 is a circuit diagram showing a semiconductor switch according the first embodiment of the present invention.

Such semiconductor switch is made up of: an input terminal 101; an output terminal 102; a through FET 106 that is connected serially to the signal path between the input terminal 101 and the output terminal 102; a shunt FET 107 that is connected in between the output terminal 102 and the ground; and a distortion reducing circuit 120 that is connected in parallel with the through FET 106. Note that the through FET 106 forms a first semiconductor circuit and the distortion reducing circuit 120 forms a second semiconductor circuit.

The distortion reducing circuit 120, which is a circuit for approximating the current-voltage characteristics of the semiconductor switch to be linear, is made up of: a first diode 109 and a second diode 110 that are placed in parallel with each other; a first constant voltage source 111 and a second constant voltage source 112 that are placed in parallel with each other and that have a voltage of 0.64V, for example; and a FET 108. In this structure, the first diode 109 has reverse characteristics in the direction from the input terminal 101 to the output terminal 102, i.e., a forward current of the first diode 109 is in the direction from the output terminal 102 to the input terminal 101, whereas the second diode 110 has forward characteristics in the direction from the input terminal 101 to the output terminal 102, i.e., a forward current of the second diode 110 is in the direction from the input terminal 101 to the output terminal 102. The FET 108 serves as a switch that prevents an electric current from flowing through the distortion reducing circuit 120 when the through FET 106 turns to the OFF-state. The first constant voltage source 111 is connected to the first diode 109 so as to shift the ON voltage of the first diode 109, whereas the second constant voltage source 112 is connected to the second diode 110 so as to shift the ON voltage of the second diode 110. Note that the first constant voltage source 111 and the second constant voltage source 112 form a first voltage generating circuit and a second voltage generating circuit, respectively.

Here, the gate electrode of the through FET 106 is connected to the control terminal 103 via a resistance 113, the gate electrode of the shunt FET 107 is connected to a control terminal 105 via a resistance 114, and the gate electrode of the FET 108 is connected to a control terminal 104 via a resistance 115. As the through FET 106, the shunt FET 107, and the FET 108, FETs with a gate width of 0.5 mm, a gate length of 0.2 μm, and a pinch-off voltage of −0.7V are used, for example. As the resistances 113, 114, and 115, resistances of 50 kΩ are used.

Figure 3:
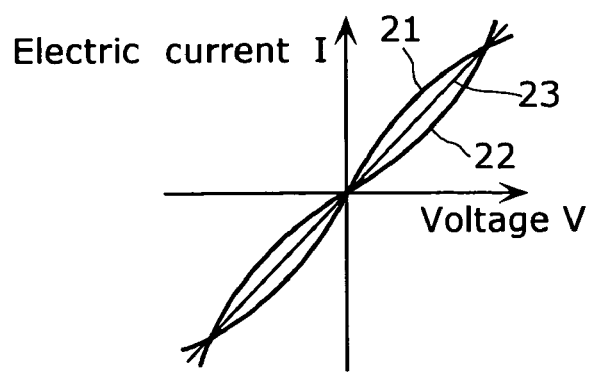
FIG. 3 is a diagram showing the current-voltage characteristics of a through FET and a distortion reducing circuit.

FIG. 3 is a diagram showing the current-voltage characteristics of the through FET 106 and the distortion reducing circuit 120.

FIG. 3 shows that current-voltage characteristics 21 of the through FET 106 when it is in the ON-state exhibit an upward convex shape in the positive domains of electric current and voltage. This is attributable to the current-voltage characteristics peculiar to a FET. Thus, the following is derived by expanding the current-voltage characteristics 21 of the through FET 106 into power series:

$$I1 = \Sigma a_i * (V1)^i$$
$$= a_0 + a_1 * V1 + a_2 * (V1)^2 + a_3 * (V1)^3 + \ldots$$

This equation shows that the third-order coefficient $a_3$ is a negative value. In the above equation, V1 denotes a voltage to be applied to the through FET 106, I1 denotes an electric current that flows through the through FET 106 when V1 is applied, and $a_i$ (i is an integer) denotes a constant.

Meanwhile, FIG. 3 also shows that current-voltage characteristics 22 of the distortion reducing circuit 120 that is connected in parallel with the through FET 106 exhibit a downward convex shape in the positive domains of electric current and voltage. This is attributable to the current-voltage characteristics peculiar to a diode. Thus, the following is derived by expanding the current-voltage characteristics 22 of the distortion reducing circuit 120 into power series:

$$I2 = \Sigma b_i * (V2)^i$$
$$= b_0 + b_1 * V2 + b_2 * (V2)^2 + b_3 * (V2)^3 + \ldots$$

This equation shows that the third-order coefficient $b_3$ is a positive value. In the above equation, V2 denotes a voltage to be applied to the distortion reducing circuit 120, I2 denotes an electric current that flows through the distortion reducing circuit 120 when V2 is applied, and $b_i$ (i is an integer) denotes a constant.

Consequently, in the semiconductor switch in which the through FET 106 and the distortion reducing circuit 120 are connected in parallel with each other, the through FET 106 and the distortion reducing circuit 120 reduce each other's nonlinear characteristics, resulting in a very small absolute value of a nonlinear component of the semiconductor switch that corresponds to the third-order coefficient included in the power series obtained by performing power series expansion. As a result, the current-voltage characteristics 23 of the semiconductor switch becomes closer to linear. In general, there is a correlation between (1) the absolute value of the n-th order coefficient that is derived by expanding, into power series, the current-voltage characteristics of the signal path between the input terminal and the output terminal and (2) the size of the n-th order harmonic distortion that is generated when a high-frequency power inputted from the input terminal reaches the output terminal. In other words, the greater the absolute value of the n-th order coefficient, the bigger the n-th order harmonic distortion generated at the through FET. It should be noted, however, that a range of voltages obtained by a power series expansion is equal to or lower than the range of the voltage amplitude of a maximum signal that passes through the through FET.

As described above, it is possible to provide a semiconductor switch that is capable of reducing harmonic distortion, since the semiconductor switch according to the present embodiment reduces, through the use of the distortion reducing circuit 120, the absolute value of the third-order coefficient that is derived by expanding the current-voltage characteristics of the through FET into power series, thereby reducing the third-order harmonic distortion generated at the through FET.

Figure 1:
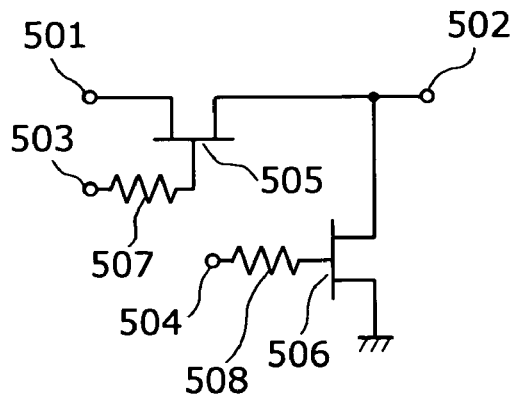
FIG. 1 is a circuit diagram showing the conventional semiconductor switch.

For example, the following result was obtained by a simulation: in the semiconductor switch shown in FIG. 2, when the through FET 106 and the FET 108 are turned to the ON-state and the shunt FET 107 is turned to the OFF-state respectively by the control terminals 103, 104, and 105, and then a high-frequency signal of 1 GHz and 30 dBm is inputted to the input terminal 101, the output value representing the third-order harmonic detected at the output terminal 102 is −49 dBm; and in the conventional semiconductor switch shown in FIG. 1 having no distortion reducing circuit, the output value representing the third-order harmonic detected at the output terminal 102 is −37 dBm. In other words, the distortion reducing circuit improves the value of the third-order harmonic distortion. Note that in the above simulation, the gate width of the through FET shown in FIG. 1 is 1 mm.

Second Embodiment

Figure 4:
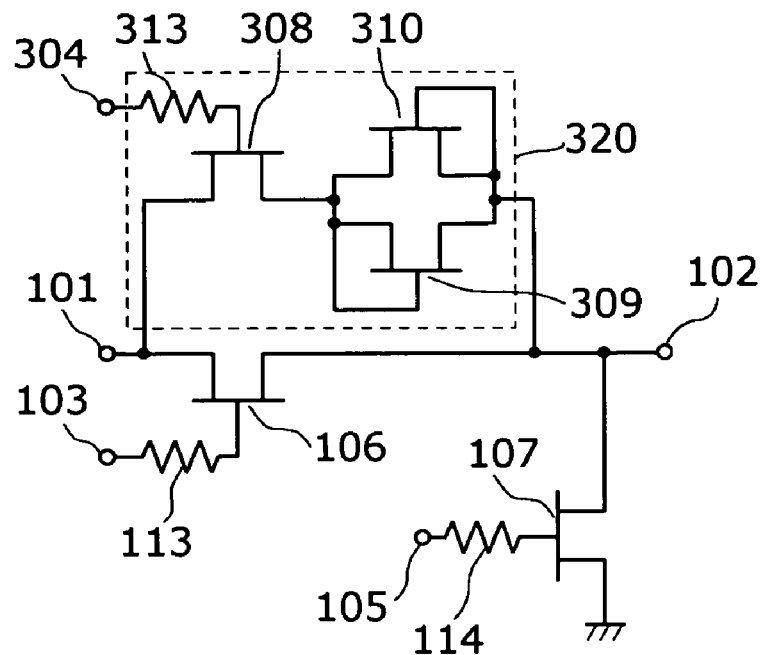
FIG. 4 is a circuit diagram showing a semiconductor switch according to a second embodiment of the present invention.

FIG. 4 is a circuit diagram showing a semiconductor switch according to the second embodiment of the present invention.

Such semiconductor switch is different from the semiconductor switch of the first embodiment in the structure of its distortion reducing circuit 320 that is connected in parallel with the through FET 106. The semiconductor switch of the second embodiment is made up of an input terminal 101, an output terminal 102, a through FET 106, a shunt FET 107, and a distortion reducing circuit 320 that is connected in parallel with the through FET 106. Note that the distortion reducing circuit 320 forms the second semiconductor circuit.

The distortion reducing circuit 320, which is a circuit for approximating the current-voltage characteristics of the semiconductor switch to be linear, is made up of: a first FET 309 and a second FET 310 that are connected in parallel with each other; and a FET 308 that is connected serially to the first FET 309 and the second FET 310. In this structure, the gate and one of the source and the drain of the first FET 309 are short-circuited at the input terminal 101 side, whereas the gate and one of the source and the drain of the second FET 310 are short-circuited at the output terminal 102 side. The FET 308 serves as a switch that prevents an electric current from flowing through the distortion reducing circuit 320 when the through FET 106 turns to the OFF-state.

Here, the gate electrode of the FET 308 is connected to a control terminal 304 via a resistance 313.

As described above, according to the semiconductor switch of the second embodiment, it is possible to provide a semiconductor switch that is capable of reducing harmonic distortion, as in the case of the semiconductor switch of the first embodiment.

Moreover, since the distortion reducing circuit 320 of the semiconductor switch of the second embodiment does not have a voltage generating circuit, it is possible to provide a semiconductor switch that is easier to manufacture than the semiconductor switch of the first embodiment.

Third Embodiment

Figure 5:
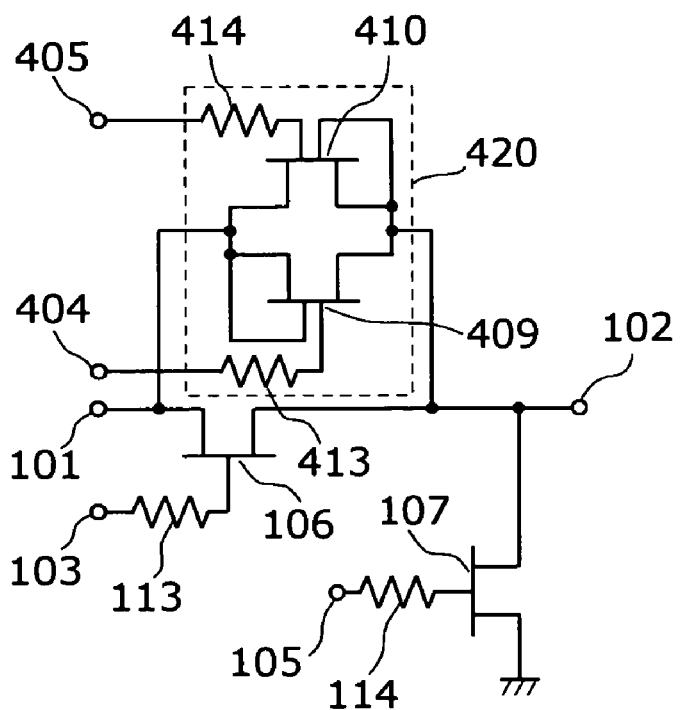
FIG. 5 is a circuit diagram showing a semiconductor switch according to a third embodiment of the present invention.

FIG. 5 is a circuit diagram showing a semiconductor switch according to the third embodiment of the present invention.

Such semiconductor switch is different from the semiconductor switch of the second embodiment in the structure of its distortion reducing circuit 420 that is connected in parallel with a through FET 106. The semiconductor switch of the third embodiment is made up of an input terminal 101, an output terminal 102, a through FET 106, a shunt FET 107, and a distortion reducing circuit 420 that is connected in parallel with the through FET 106. Note that the distortion reducing circuit 420 forms the second semiconductor circuit.

The distortion reducing circuit 420, which is a circuit for approximating the current-voltage characteristics of the semiconductor switch to be linear, is made up of a first dual gate FET 409 and a second dual gate FET 410 that are connected in parallel with each other. In this structure, one of the gates and the source or the drain of the first dual gate FET 409 are short-circuited at the input terminal 101 side, whereas one of the gates and the source or the drain of the second dual gate FET 410 are short-circuited at the output terminal 102 side. The other gate of the first dual gate FET 409 is connected to a control terminal 404 via a resistance 413, whereas the other gate of the second dual gate FET 410 is connected to a control terminal 405 via a resistance 414. The first dual gate 409 and the second dual gate 410 serve as switches that prevent an electric current from flowing through the distortion reducing circuit 420 when the through FET 106 turns to the OFF-state.

As described above, according to the semiconductor switch of the third embodiment, it is possible to provide a semiconductor switch that is capable of reducing harmonic distortion, as in the case of the semiconductor switch of the first embodiment.

Moreover, it is possible to provide a small semiconductor switch since the multi-gate FETs are used in the distortion reducing circuit 420 of the semiconductor switch of the third embodiment, and thus there is no need to be equipped with a FET dedicated to preventing an electric current from flowing through the distortion reducing circuit 420. In other words, it is possible to provide a semiconductor switch whose chip area can be reduced.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, the semiconductor switch according to the present invention has a distortion reducing circuit in which the sign of the third-order coefficient that is derived by expanding the current-voltage characteristics into power series, is different from that of the through FET. However, the distortion reducing circuit is not limited to this so long as the current-voltage characteristics of a distortion reducing circuit have a linear shape representing desired current-voltage characteristics, e.g., a shape that is axisymmetric to the current-voltage characteristics of the through FET with respect to the straight line going through the point of origin. Thus, the semiconductor switch may include a distortion reducing circuit in which the sign of the second or greater-order coefficient that is derived by expanding the current-voltage characteristics into power series is different from that of the through FET.

INDUSTRIAL APPLICABILITY

The present invention is suited for use as a semiconductor switch and particularly as a high-frequency semiconductor switch or the like that is used for switching between signal transmission and reception in an antenna of a mobile communication device such as a mobile phone and the like.

What is claimed is:

1. A semiconductor switch, comprising:
a first semiconductor circuit having a nonlinear characteristic; and
a second semiconductor circuit having a nonlinear characteristic,
wherein each of the first semiconductor circuit and the second semiconductor circuit is configured to at least one of allow and interrupt transmission of a signal,
wherein said first semiconductor circuit compensates for the nonlinear characteristic of said second semiconductor circuit and said second semiconductor circuit compensates for the nonlinear characteristic of said first semiconductor circuit,
wherein a current-voltage relationship of said first semiconductor circuit is characterized by the equation $I1=\Sigma a_i*(V1)^i$, where V1 is a voltage applied to said first semiconductor circuit, I1 is an electric current that passes through said first semiconductor circuit when V1 is applied, and a is a constant,
wherein a current-voltage relationship of said second semiconductor circuit is characterized by the equation $I2=\Sigma b_i*(V2)^i$, where V2 is a voltage applied to said second semiconductor circuit, I2 is an electric current that passes through said second semiconductor circuit when V2 is applied, and $b_i$ is a constant, and
wherein the signs of $a_j$ and $b_j$ of at least one pair of $a_i$ and $b_i$ are different, where j is an integer with a value of at least 2.

2. A semiconductor switch, comprising:
a first semiconductor circuit having a nonlinear current-voltage characteristic; and
a second semiconductor circuit having a nonlinear current-voltage characteristic,
wherein each of the first semiconductor circuit and the second semiconductor circuit is configured to at least one of allow and interrupt transmission of a signal,
wherein said first semiconductor circuit compensates for the nonlinear current-voltage characteristic of said second semiconductor circuit and said second semiconductor circuit compensates for the nonlinear current-voltage characteristic of said first semiconductor circuit.

3. The semiconductor switch according to claim 2,
wherein a current-voltage relationship of said first semiconductor circuit is characterized by the equation $I1=\Sigma a_i*(V1)^i$, where V1 is a voltage applied to said first semiconductor circuit, I1 is an electric current that passes through said first semiconductor circuit when V1 is applied, and $a_i$ is a constant,
wherein a current-voltage relationship of said second semiconductor circuit is characterized by the equation $I2=\Sigma b_i*(V2)^i$, where V2 is a voltage applied to said second semiconductor circuit, I2 is an electric current that passes through said second semiconductor circuit when V2 is applied, and $b_i$ is a constant, and
wherein the signs of $a_j$ and $b_j$ of at least one pair of $a_i$ and $b_i$ are different, where j is an integer with a value of at least 2.

4. The semiconductor switch according to claim 3,
wherein said first semiconductor circuit is connected in parallel with said second semiconductor circuit,
wherein said first semiconductor circuit includes a field-effect transistor, and
wherein said second semiconductor circuit includes at least one diode.

5. The semiconductor switch according to claim 4,
wherein said at least one diode of said second semiconductor circuit comprises a first diode placed in parallel with a second diode,
wherein a forward current of said first diode is in a direction from a signal output side to a signal input side of said second semiconductor circuit, and wherein a forward current of said second diode is in a direction from the signal input side to the signal output side of said second semiconductor circuit.

6. The semiconductor switch according to claim 5, wherein said second semiconductor circuit further comprises a first voltage generating circuit that is connected to said first diode and that shifts an ON-voltage of said first diode and a second voltage generating circuit that is connected to said second diode and that shifts an ON-voltage of said second diode.

7. The semiconductor switch according to claim 3, wherein said first semiconductor circuit is connected in parallel with said second semiconductor circuit, wherein said first semiconductor circuit includes a field-effect transistor, and wherein said second semiconductor circuit includes at least one field-effect transistor in which a gate and one of a source and a drain are short-circuited.

8. The semiconductor switch according to claim 7, wherein said second semiconductor circuit comprises a first field-effect transistor placed in parallel with a second field-effect transistor, wherein a gate and one of a source and a drain of said first field-effect transistor are short-circuited at a signal input side of said second semiconductor circuit, and wherein a gate and one of a source and a drain of said second field-effect transistor are short-circuited at a signal output side of said second semiconductor circuit.

9. The semiconductor switch according to claim 3, wherein each of said first field-effect transistor and said second field-effect transistor comprises a multi-gate field-effect transistor.

10. The semiconductor switch according to claim 7, wherein said at least one field-effect transistor of said second semiconductor circuit comprises a multi-gate field-effect transistor.

11. The semiconductor switch according to claim 2, wherein said first semiconductor circuit is connected in parallel with said second semiconductor circuit, wherein said first semiconductor circuit includes a field-effect transistor, and wherein said second semiconductor circuit includes at least one diode.

12. The semiconductor switch according to claim 11, wherein said at least one diode of said second semiconductor circuit comprises a first diode placed in parallel with a second diode, wherein a forward current of said first diode is in a direction from a signal output side to a signal input side of said second semiconductor circuit, and wherein a forward current of said second diode is in a direction from the signal input side to the signal output side of said second semiconductor circuit.

13. The semiconductor switch according to claim 12, wherein said second semiconductor circuit further comprises a first voltage generating circuit that is connected to said first diode and that shifts an ON-voltage of said first diode and a second voltage generating circuit that is connected to said second diode and that shifts an ON-voltage of said second diode.

14. The semiconductor switch according to claim 2, wherein said first semiconductor circuit is connected in parallel with said second semiconductor circuit, wherein said first semiconductor circuit includes a field-effect transistor, and wherein said second semiconductor circuit includes a field-effect transistor in which a gate and one of a source and a drain are short-circuited.

15. The semiconductor switch according to claim 14, wherein said second semiconductor circuit comprises a first field-effect transistor placed in parallel with a second field-effect transistor, wherein a gate and one of a source and a drain of said first field-effect transistor are short-circuited at a signal input side of said second semiconductor circuit, and wherein a gate and one of a source and a drain of said second field-effect transistor are short-circuited at a signal output side of said second semiconductor circuit.

16. The semiconductor switch according to claim 15, wherein each of said first field-effect transistor and said second field-effect transistor comprises a multi-gate field-effect transistor.

17. The semiconductor switch according to claim 14, wherein said at least one field-effect transistor of said second semiconductor circuit comprises a multi-gate field-effect transistor.

18. The semiconductor switch according to claim 2, wherein said second semiconductor circuit reduces distortion in said first semiconductor circuit.

19. The semiconductor switch according to claim 18, wherein said second semiconductor circuit reduces third-order harmonic distortion in the first semiconductor circuit.

* * * * *